(12) United States Patent
Terashima et al.

(10) Patent No.: US 6,463,119 B1
(45) Date of Patent: Oct. 8, 2002

(54) EXPOSURE METHOD, EXPOSURE APPARATUS AND SEMICONDUCTOR MANUFACTURING APPARATUS

(75) Inventors: Shigeru Terashima; Takeshi Miyachi, both of Utsunomiya; Yutaka Watanabe, Tochigi-ken; Kazuyuki Kasumi, Utsunomiya, all of (JP)

(73) Assignee: Canon Kabushiki Kaisha, Tokyo (JP)

(*) Notice: Subject to any disclaimer, the term of this patent is extended or adjusted under 35 U.S.C. 154(b) by 49 days.

(21) Appl. No.: 09/589,812

(22) Filed: Jun. 9, 2000

(30) Foreign Application Priority Data

Jun. 14, 1999  (JP) .............................. 11-167419

(51) Int. Cl.$^7$ ................................................ G21K 5/00
(52) U.S. Cl. ........................................................ 378/34
(58) Field of Search ........................................... 378/34

(56) References Cited

U.S. PATENT DOCUMENTS

| | | | |
|---|---|---|---|
| 5,125,014 A | 6/1992 | Watanabe et al. | 378/34 |
| 5,157,700 A | 10/1992 | Kurosawa et al. | 378/34 |
| 5,377,251 A | * 12/1994 | Mizusawa et al. | 378/34 |
| 5,600,698 A | 2/1997 | Terashima et al. | 378/34 |
| 5,606,586 A | 2/1997 | Amemiya et al. | 378/34 |

FOREIGN PATENT DOCUMENTS

| | | |
|---|---|---|
| JP | 7-281417 | 10/1995 |
| JP | 7-283128 | 10/1995 |
| JP | 10-294272 | 11/1998 |

* cited by examiner

*Primary Examiner*—Craig E. Church
(74) *Attorney, Agent, or Firm*—Fitzpatrick, Cella, Harper & Scinto

(57) ABSTRACT

An exposure apparatus for exposing a photosensitive substrate to a pattern on a mask within an exposure view angle to transfer the pattern onto the photosensitive substrate using X-ray as exposure radiation, wherein exposure light on the mask is limited by a light blocking plate for blocking the exposure radiation, thus accomplishing efficient manufacturing of the semiconductor devices.

6 Claims, 4 Drawing Sheets

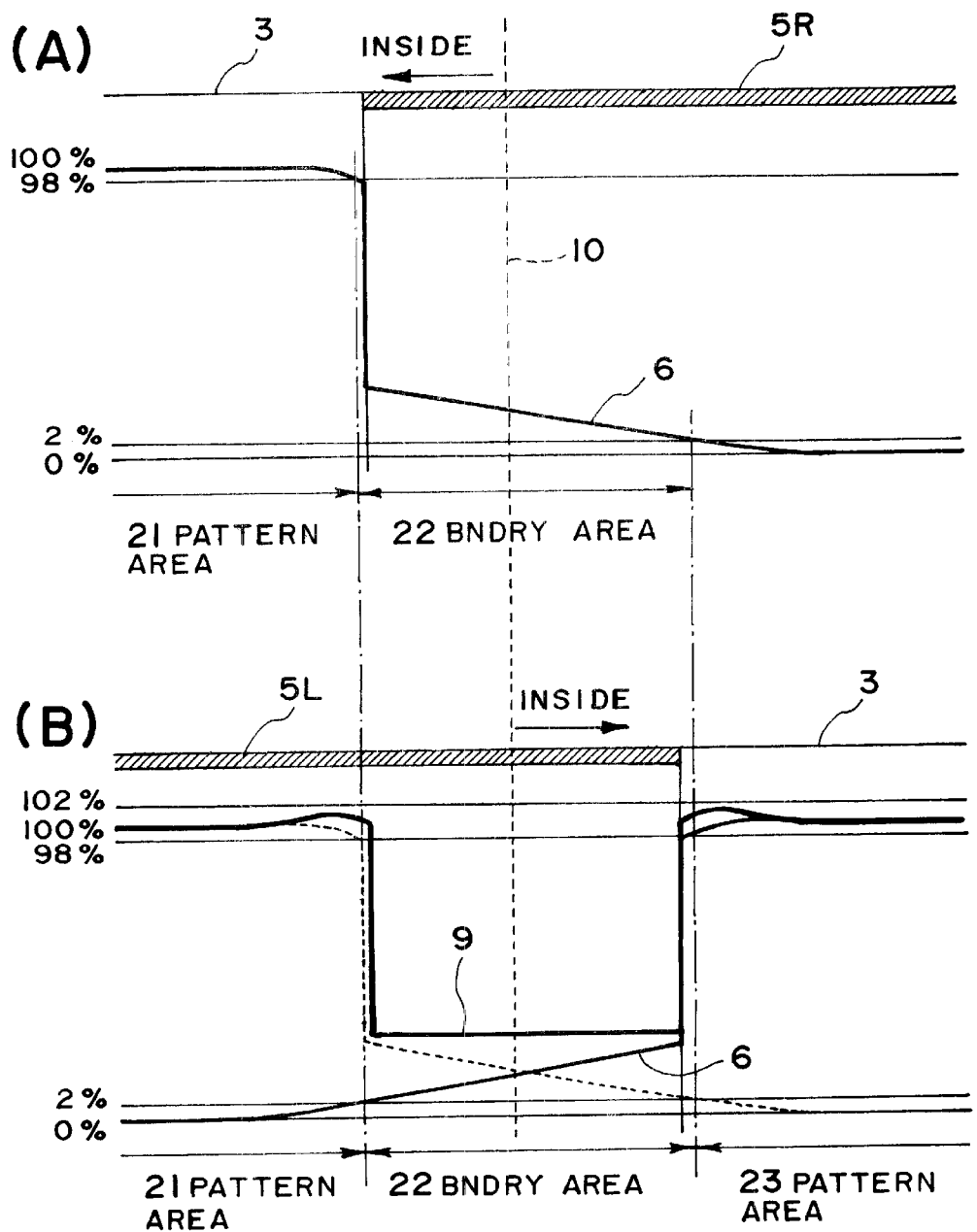
F I G. 4

EXPOSURE METHOD, EXPOSURE APPARATUS AND SEMICONDUCTOR MANUFACTURING APPARATUS

FIELD OF THE INVENTION AND RELATED ART

The present invention relates to an exposure method and an exposure device, which is particularly suitable for exposure and transfer operations of a step-and-repeat type and a step-and-scan type in which a photosensitive substrate such as a wafer or a glass substrate coated with a photosensitive material is exposed to a fine electronic circuit pattern formed on a surface of a mask using X-ray such as synchrotron radiation (SR) or plasma X-ray radiation source.

A X-ray exposure method and X-ray exposure device for manufacturing devices using X-ray generated by synchrotron radiation or plasma X-ray source or another X-ray source have been proposed.

Generally, the X-ray exposure device requires a light blocking plate, disposed in the optical path, for blocking X-ray to limit an exposure view angle (exposure area). This is different from a light exposure device using i-line, or an excimer laser beam or the like wherein the exposure area and the non-exposure area can be clearly separated by a light blocking film provided on the mask. On the contrary, in the X-ray exposure device, a light blocking film of X-ray absorbing material provided on the mask cannot completely block the X-ray, and several to 40% approx is passed, that is, it at most reduced the radiation, and in the X-ray is projected widely covering the light blocking film around the exposure view angle, the X-ray absorbing material constituting the light blocking film absorbs the X-ray with the result of rising of the mask temperature and therefore deviation of the pattern of the mask in the exposure view angle. This is the reason for the requirement of the light blocking plate in the optical path for the radiation.

When the light blocking plate for blocking the X-ray is disposed in the optical path (radiation path) of the X-ray exposure device in other to limit the exposure view angle (exposure area), the following problems arise.

In order to accomplish the limiting of the exposure view angle, the function of changing the exposure view angle in accordance with the area to be transferred (exposure area) of the mask. In order to limit the area to be transferred of the mask, the light blocking plates have to be provided which are movable in four directions, respectively, with high precision without mechanical interference with the mask and mask supporting members.

For this reason, the light blocking plates have to be disposed quite away from the mask. In this case, the positional relation among the size of the radiation source, the light blocking plate and the mask, a boundary region called penumbra due to the light blocking plate in which the amount of the projection X-ray gradually decreases, is generated on the mask.

Even if the light source is a very small, and the radiation source is distant from the mask, the width of the boundary region, that is, the penumbra is not negligible because of the influence of the diffraction if the surface to be exposed (wafer surface) and light blocking plate are away from each other by a substantial distance. As a result, there exist areas which cannot be used for the exposure, on the mask, and additionally, a small amount of the projection X-ray enters the adjacent exposure area.

Particularly in the case of the X-ray exposure device using the synchrotron radiation as the radiation source, the apparent shape of the radiation source is elliptical, and therefore, a marginal portion of the penumbra provided by the light blocking plate for limiting the exposure view angle may enter the adjacent exposure area.

It would be a solution to provide a boundary region having a sufficient area without any transfer pattern at all, around the transfer region (exposure area). However, this solution results in wasteful area enlarged, and therefore, the efficiency of the devices is low.

SUMMARY OF THE INVENTION

Accordingly, it is a principal object of the present invention to provide an exposure method and an exposure device in which the width of the boundary region can be reduced so that devices can be manufactured with high efficiency and stability.

According to an aspect of the present invention, there is provided an exposure method using X-ray as exposure radiation, comprising a step of preparing a light blocking plate, disposed in an optical path, for blocking the exposure radiation; a step of limiting an exposure view angle on the mask by a light blocking plate such that area of penumbra provided on the mask by the light blocking plate cover an inner edge portion of a low intensity region formed on the mask; and a step of exposure and transfer of a pattern within the exposure view angle on the mask onto a photosensitive substrate.

According to another aspect of the present invention, there is provided an exposure method using X-ray as exposure radiation, comprising: a step of preparing a light blocking plate, disposed in an optical path, for blocking the exposure radiation; a step of limiting an exposure view angle on a mask by a light blocking plate in accordance with selection of exposure of an area outside an exposure area to be projected and transferred onto a photosensitive substrate; a step of exposure and transfer of a pattern within the exposure view angle on the mask onto a photosensitive substrate.

According to a further aspect of the present invention, there is provided an exposure apparatus, using X-ray as exposure radiation, for exposing a photosensitive substrate to a pattern within an exposure view angle on a mask to transfer the pattern onto the photosensitive substrate, said apparatus comprising a light blocking plate, disposed in an optical path for the exposure radiation, for limiting the exposure view angle on the mask by blocking the exposure radiation; driving means for driving said light blocking plate such that area of penumbra provided on the mask by the light blocking plate cover an inner edge portion of a low intensity region formed on the mask.

According to a further aspect of the present invention, there is provided an exposure apparatus, using X-ray as exposure radiation, for exposing a photosensitive substrate to a pattern within an exposure view angle on a mask to transfer the pattern onto the photosensitive substrate, said apparatus comprising a light blocking plate, disposed in an optical path for the exposure radiation, for limiting the exposure view angle on the mask by blocking the exposure radiation; driving means for driving said light blocking plate in accordance with selection of exposure of an area outside an exposure area to be projected and transferred onto a photosensitive substrate.

According to a further aspect of the present invention, there is provided a semiconductor device manufacturing method comprising a step of relative position alignment between a mask and a photosensitive substrate; a step of exposure and transfer of a pattern within the exposure view angle on the mask onto a photosensitive substrate, using X-ray as exposure radiation; said exposure step including: a step of preparing a light blocking plate, disposed in an optical path, for blocking the exposure radiation; a step of limiting an exposure view angle on the mask by a light blocking plate such that area of penumbra provided on the mask by the light blocking plate cover an inner edge portion of a low intensity region formed on the mask; and said manufacturing method further including: a step of developing the photosensitive substrate onto which the pattern has been transferred.

According to a further aspect of the present invention, there is provided a semiconductor device manufacturing method comprising: a step of relative position alignment between a mask and a photosensitive substrate; a step of exposure and transfer of a pattern within the exposure view angle on the mask onto a photosensitive substrate, using X-ray as exposure radiation; said exposure step including: a step of preparing a light blocking plate, disposed in an optical path, for blocking the exposure radiation; a step of limiting an exposure view angle on a mask by a light blocking plate in accordance with selection of exposure of an area outside an exposure area to be projected and transferred onto a photosensitive substrate; said manufacturing method further including: a step of developing the photosensitive substrate onto which the pattern has been transferred.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 4 is an illustration of a distribution of an exposure intensity on the mask and on the photosensitive substrate according to Embodiment 2 of the present invention in which the boundary region does not require the exposure.

DESCRIPTION OF THE PREFERRED EMBODIMENTS

Figure 1:
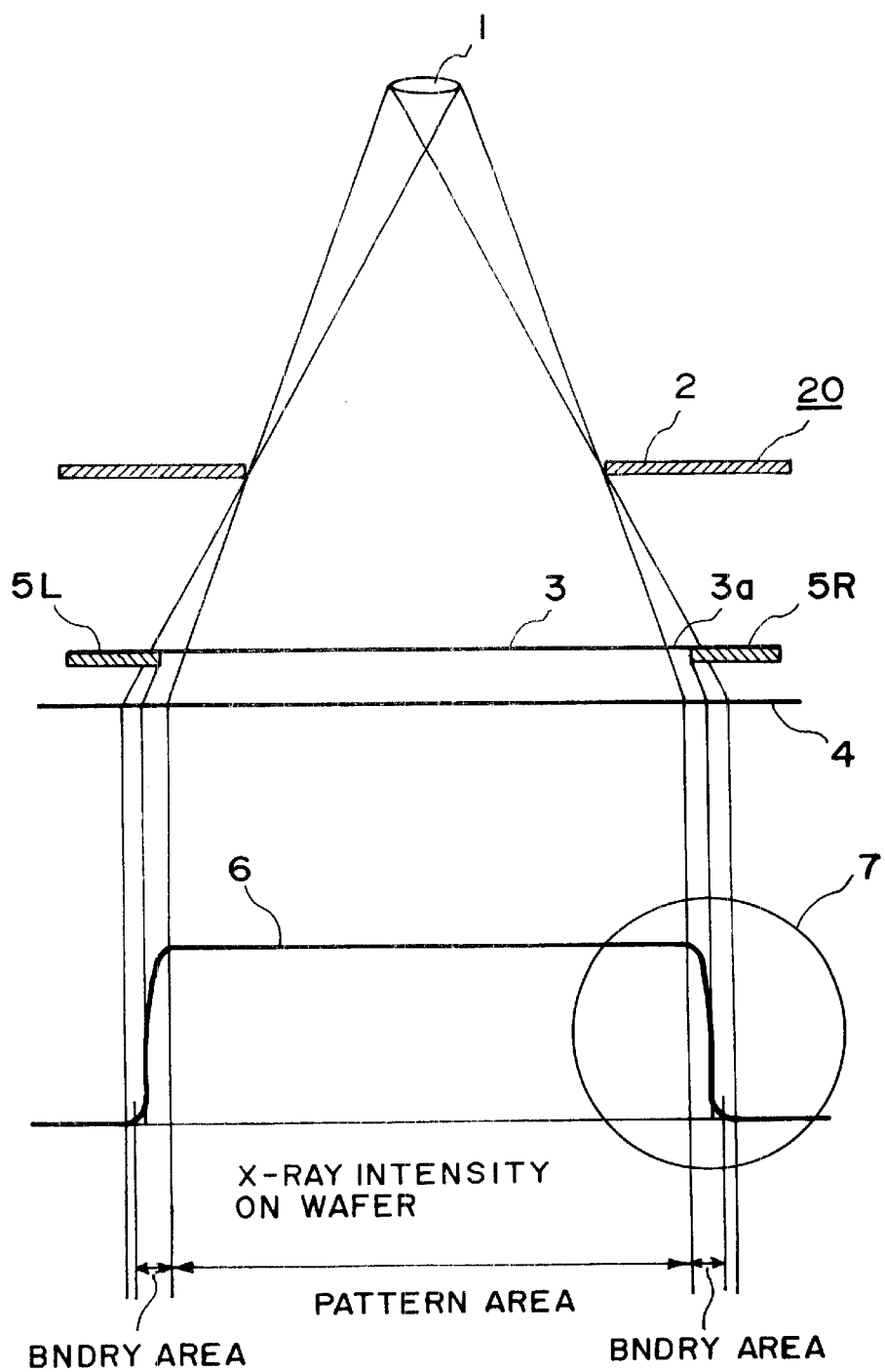
FIG. 1 illustrates a major part of an exposure device according to Embodiment 1 of the present invention.

FIG. 1 schematically shows a major part of an exposure device using X-ray according to Embodiment 1 of the present invention. In this embodiment, the exposure device is shown as a proximity type semiconductor device manufacturing apparatus, using the X-ray as the exposure radiation. In FIG. 1, designated by 1 is a X-ray source; 2 is a light blocking plate for limiting the exposure view angle; and 3 is a mask for the X-ray exposure which has a predetermined transfer pattern thereon. The radiation blocking plate is movable to a given position by driving means 20. Designated by 4 is a photosensitive substrate in the form of a wafer; 5L, 5R are X-ray absorbing materials disposed outside the exposure view angle of the mask 3, which normally define a frame, but for the simplicity of explanation, the left side is indicated as absorbing material 5L, and the righthand side is indicated as absorbing material 5R in the Figure. Designated by 6 is a strength distribution of the exposure X-ray in one direction on the wafer 4. FIG. 1 schematically illustrates the one-to-one exposure and transfer from the mask 3 onto the wafer 4 using the X-ray.

The exposure device of this embodiment comprises an alignment portion for alignment between the mask 3 and the wafer 4, stages for supporting a shutter, the wafer 4, the mask 3 and the like, but they are omitted for simplicity.

The positional relation is schematically shown in the FIG. 1, and, for example, when the X radiation source is a synchrotron radiation, the X radiation source 1 is far away from the mask 3, whereas the mask 3 and the wafer 4 are spaced only by several tens micron. The light blocking plate 2 for limiting the exposure view angle is supported on the exposure apparatus and is disposed approx several mm to several tens mm away from the surface of the mask 3 to permit movement thereof.

As shown in FIG. 1, when the X-ray is projected onto the mask 3 from the X-ray source 1, the light blocking plate 2 blocks the X-ray. At this time, a penumbra (blurrness) 3a of the X-ray is generated at the edge of the exposure view angle on the mask.

Figure 2:
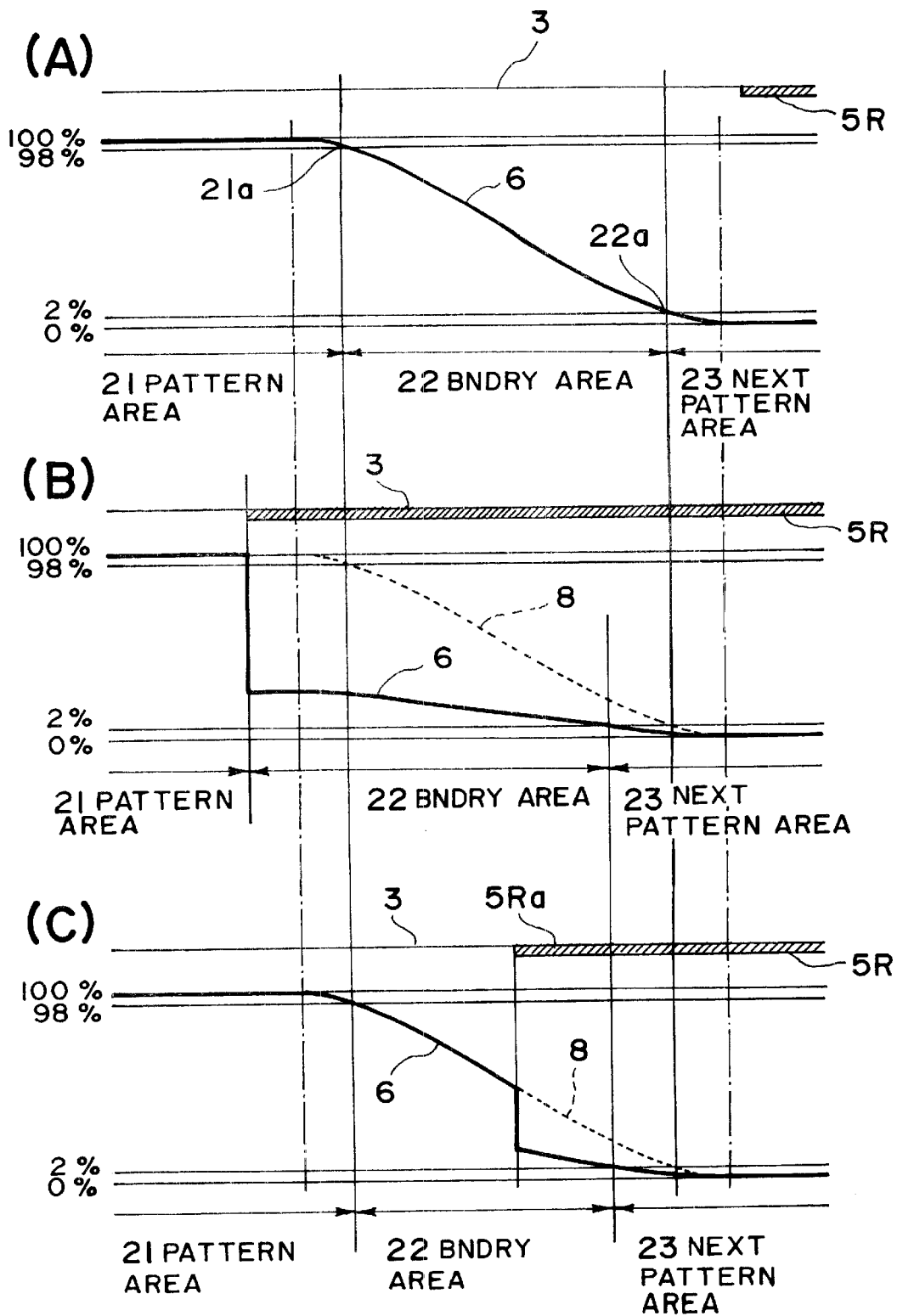
FIG. 2 is an illustration of a distribution of an exposure intensity on the mask and on the photosensitive substrate according to Embodiment 1 of the present invention.

According to this embodiment, the penumbra portion 3a is overlapped with the absorbing material region (5R, 5L) of the mask 3, so that amount of the X-ray is limited at the edge of the penumbra. FIG. 2 shows in detail the region 7 in which the strength distribution is changing at the edge of the exposure view angle, that is, the area enclosed by a circle in FIG. 1. FIGS. 2, (A), (B) and (C) show an example in which the strength distribution 6 of the exposure X-ray on the wafer 4 changes due to the relation between the position in which the strength distribution changes due to the penumbra 3a and the position of the X-ray absorbing material 5R disposed at the outer peripheral of the transfer pattern region on the mask 3.

Ideally, the projection intensity is 100% in the exposure area and 0% in the other area, but actually this is difficult. Practically, therefore, the intensity in the exposure area is 98%, and the non-exposed portion is 2%, on the basis of which the exposure area and the non-exposure area are defined. In other words, the tolerance of the exposure amount relative to the target level is plus and minus 2% in this example.

In FIGS. 2, (A), (B) and (C), the lines indicated by 98% and 2% are threshold lines. The values used here are only examples, and proper values are selected properly by one skilled in the art, depending on the exposure process, the sensitivity of the resist.

As shown in FIG. 2, (A), the exposure area (pattern region) 21, the boundary region 22 and the non-exposure area (next pattern region) 23 are divided by the intersection point 21a, 22a points 21a, 22a between the thresholds (98% and 2%) and the intensity distribution curve. The non-exposure area 23 shown in the Figure may be an exposure area of the next shot area.

FIG. 2, (A) shows a conventional example of a distribution of the X-ray projection intensity onto the mask 3. The X-ray absorbing material 5R outside the exposure view angle on the mask 3 is formed on the portion on which the X-ray is not projected in FIG. 2, (A), the same applies to the case where it is not formed.

The boundary region 22 existing between the exposure area 21 and the non-exposure area (next exposure area) 23 in this case is the area in which the intensity is 98% to 2% of the intensity distribution curve 6. Conventionally, the portion of the width has not been used for the exposure since it is the non-usable area peculiar to the X-ray exposure device.

FIG. 2, (B) shows the case in which the X-ray absorbing material 5R outside the exposure view angle on the mask 3 is formed extended to the pattern region 21 which is exposed to the X-ray.

Here, the intensity distribution curve 8 is similar to the curve 6 shown in FIG. 2, (A).

The intensity distribution curve 6 shown in FIG. 2, (B) represents the intensity distribution when the absorbing material 5R absorbs a part of the projection X-ray.

FIG. 2, (B) shows the case in which the absorbing material 5R is formed to the pattern region 21 so that intensity distribution curve 8 is changed to the intensity distribution curve 6.

If the design is on the safety side in order to avoid the influence of the area in which the intensity distribution changes while the variation in the exposure amount in the exposure area 21, the exposure is prevented in the penumbra region 22. In such case, the boundary region 22 existing between the exposure area 21 and the exposure area 23 has the width shown in the Figure.

FIG. 2, (C) illustrates an embodiment of the present invention. The difference between the FIG. 2, (C) and FIGS. 2, (A), (B) is in that inner edge of the X-ray absorbing material 5R outside the exposure view angle on the mask 3 is made to overlap with the penumbra region 22.

The inner edge 5Ra of the X-ray absorbing material 5R which is the boundary of the exposure view angle of the X-ray mask 3 is placed in the area which is the boundary region 22 outside the proper exposure amount area described in conjunction with FIG. 2, (A), that is, which involves non-uniform intensity distribution.

As will be understood from comparison among (A), (B) and (C) in FIG. 2, by placing the inner edge 5Ra of the X-ray absorbing material 5R within the penumbra region 22, the width of the boundary region 22 is smaller than in (A) and (B) in FIG. 2. By decreasing the width of the boundary region 22 in this manner, the exposure area can be expanded in the exposure system according to this embodiment.

As described in the foregoing, according to the present invention, the use is made with the mask having a light blocking portion or a low intensity regions 5R, 5L of the X-ray absorbing material which is similar to the transfer pattern, in a predetermined portion or portions outside the transfer pattern region 21, so that region 22 of the penumbra provided by the light blocking plate for limiting the exposure view angle of the exposure device is placed by the light blocking plate 2 moved by driving means such that region 22 contains the inner edge portion of the light-blocked area 5R, 5L. By doing so, the light blocking plate of the apparatus assures the exposure area of the transfer pattern, and the low intensity region 5R, 5L of the mask sufficiently reduces the X-ray intensity in the penumbra provided by the light blocking plate to suppress the entering into the adjacent pattern region.

Figure 3:
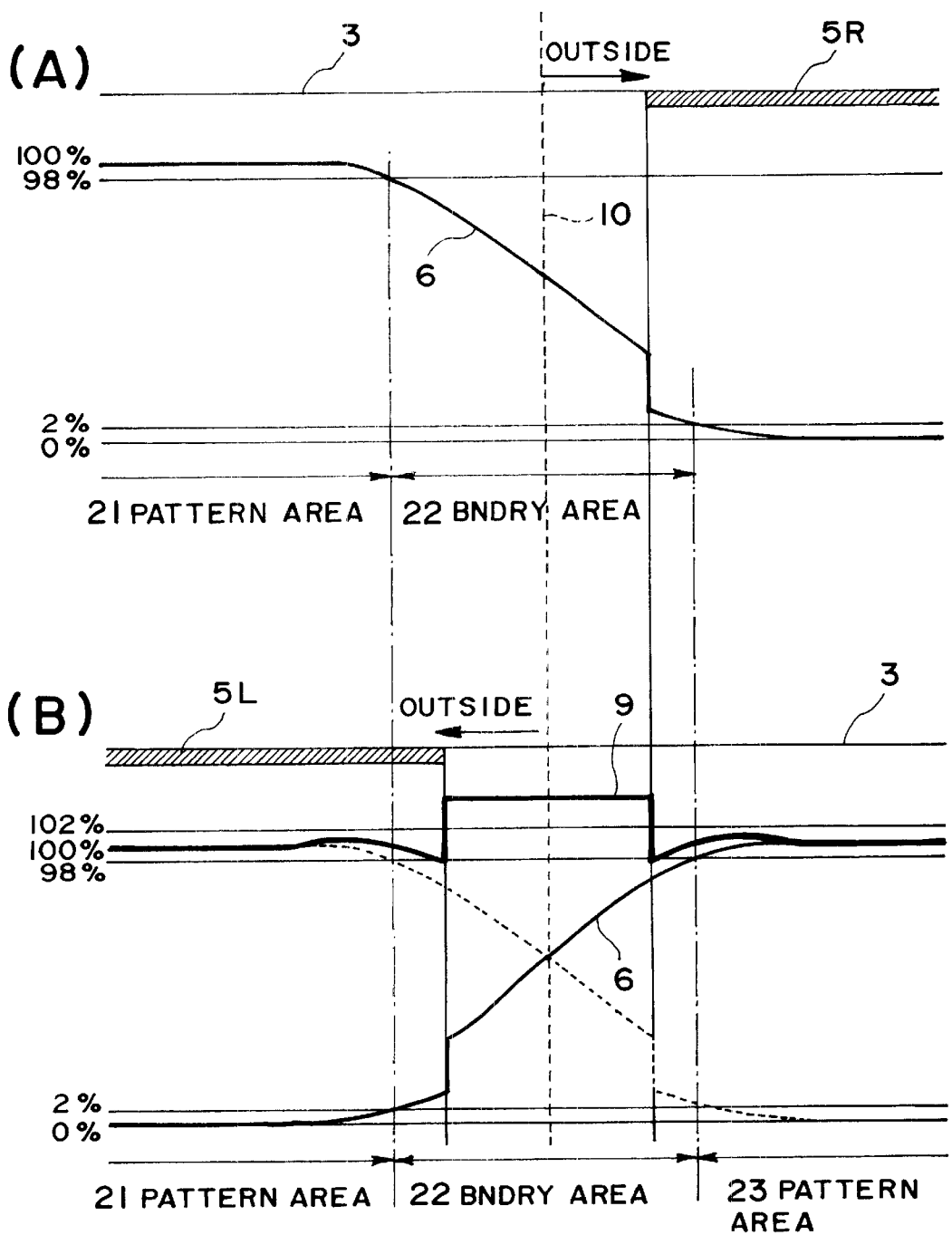
FIG. 3 is an illustration of a distribution of an exposure intensity on the mask and on the photosensitive substrate in Embodiment 2 of the present invention in which a boundary region has to be exposed.

FIGS. 3, 4 are schematic illustration of the major part in Embodiment 2 of the present invention. In this embodiment, the gap between the transfer pattern region and the light blocking portion or low intensity region is selected in accordance with the property of the resist useed in the transfer step, the order of the steps or the material of the film to be processed; and the portion of the penumbra provided by the light blocking plate for limiting the exposure view angle is projected to the light blocking portion or the low intensity region; and the exposure and the non-exposure of the boundary region of the outer periphery of the transfer pattern is selected using the penumbra. Particularly, in this embodiment, the selection between the exposure and non-exposure of the boundary region 22 depending on the exposure step and the resist is enabled; and the corresponding X-ray absorbing materials 5L, 5R outside the exposure area on the X-ray mask 3.

In FIGS. 3, (A) and (B), the case of the necessary exposure of the boundary region is shown when the adjacent exposure areas are exposed. As shown in FIG. 3, (A), the left side pattern region 21 is exposed. The solid line 6 shows the influence of the penumbra provided by the light blocking plate (not shown) and the distribution of the projection X-ray intensity on the wafer provided by the X-ray absorption pair 5R disposed outside the transfer pattern of the mask 3.

Then, as shown in FIG. 3, (B), right side pattern region 23 is exposed. Similarly to the foregoing case, the exposure occurs to the boundary region 22, and the intensity distribution of the projection X-ray on the wafer is as indicated by the solid line 6 in FIG. 3, (B). In the boundary region 22 the exposure amount distribution 9 is a sum of the two exposures. Thus, in order to exposegg the boundary region 22, the light blocking plate 2 is moved by the driving means such that X-ray absorbing materials 5R, 5L outside the exposure area which defines the exposure area on the mask is disposed outside the center 10 of the penumbra region. As indicated by the total exposure amount 9, the exposure amount at the center portion (boundary region 22) is excessive, but the exposure amounts at the both sides thereof (pattern region 21, 23) are proper. Since the boundary region 22 does not include the fine pattern, and therefore, the resist is assuredly exposed if the exposure amount is larger, so that there is no practical problem.

The case that boundary portion is required to be exposed, occurs, for example, when the resist in the boundary region is to be removed during the development in the process using positive-type resist or when the resist in the boundary region is to be retained during the development in the process using negative type resist.

FIGS. 4, (A) and (B) show the position of the X-ray absorbing material 5R in the case that it is not necessary to expose the boundary region 22. Similar to the case of FIG. 3, the curve 6 represents the distribution of the exposure amount on the wafer provided by the exposure of the first left side pattern region 21.

The curve 9 represents a distribution of the integrated exposure amount when the righthand side pattern region 23 is exposed.

In order to prevent the exposure of the boundary region 22, the light blocking plate 2 is moved by the driving means 20 such that X-ray absorbing materials 5L, 5R outside the exposure area defined on the mask 3 is disposed inside the center line 10 of the penumbra region (boundary region 22), as shown in the Figure. Particularly, by setting such that absorbing material 5R is covered all over the boundary region 22 from the position very close to the outside of the necessary exposure area (pattern region 21), the distribution 9 of the total exposure amount which is the sum of the exposures from both sides is less than the threshold of the photosensitivity of the resist, and therefore, the resist remains there, as shown in Figure. However, as indicated by a solid line 9 in the Figure, the amount of the exposure is not zero, but is several percent to 30% approx, which is not large though. For this reason, an adjustment relative to the threshold of the photosensitivity of the resist is desirable. By the development, the thickness of the resist may be reduced in a case, but it occurs outside the fine pattern region (21, 23), and therefore, the tolerance is relatively large. The case that boundary portion is required to be exposed, occurs, for example, when the resist in the boundary region is to be retained during the development in the process using positive-type resist or when the resist in the boundary region is to be removed during the development in the process using negative type resist.

It has been decided before or during the mask design how to process the resist in the boundary region, and therefore, the absorbing materials 5R, 5L are placed at either of the above positions accordingly.

When the device is manufactured, using the exposure method of Embodiment 1 or 2, the process includes a step of relative positional alignment between the mask and wafer and a developing step of developing the wafer after the pattern on the surface of the mask is projected and transferred onto the wafer surface.

According to the present invention, there is provided an exposure method and an exposure device wherein the width of the boundary region influenced by the penumbra when the device is manufactured using the X-ray, so that devices can be manufactured with high efficiency and stability.

Additionally, according to the present invention, the width of the boundary region existing between the pattern region to be transferred and the next pattern region can be reduced, so that exposure area can be expanded, and therefore, the devices can be manufactured efficiently.

Furthermore, by providing an absorbing material at a predetermined position outside the exposure area of the mask and projecting the penumbra of the light blocking plate to the position, it is possible to make selection whether to retain the resist or not, and therefore, the stability of the process can be improved.

While the invention has been described with reference to the structure disclosed herein, it is not confined to the details set forth and this application is intended to cover such modifications or changes as may come within the purposes of the improvements or the scope of the following claims.

What is claimed is:

1. An exposure method using X-rays as an exposure beam, said method comprising:
    a step of setting, in an optical path, a light blocking member for limiting a view angle of exposure by blocking a portion of the exposure beam;
    a step of setting in the view angle an X-ray transfer mask having an attenuation area for attenuating the exposure beam at an outer periphery of a pattern to be transferred;
    a step of setting a view angle of exposure on the mask by positioning the light blocking member such that an inner edge of the attenuation area of the X-ray transfer mask overlaps a penumbra of the exposure beam provided by the light blocking member on the mask; and
    a step of exposing a photosensitive substrate to the pattern to be transferred, formed on the mask in the view angle, to transfer the pattern onto the substrate.

2. An exposure method using X-rays as an exposure beam, said method comprising:
    a step of setting, in an optical path, a light blocking member for limiting a view angle of exposure by blocking a portion of the exposure beam;
    a step of setting in the view angle an X-ray transfer mask having an attenuation area for attenuating the exposure beam at an outer periphery of a pattern to be transferred;
    a step of setting a view angle of exposure on the mask by positioning the light blocking member such that an inner edge of the attenuation area of the X-ray transfer mask overlaps a penumbra of the exposure beam provided by the light blocking member on the mask;
    a step of determining whether to expose the substrate with an outer area of the pattern to be transferred;
    a step of controlling a position of the light blocking plate in accordance with a result of a determination in said determining step; and
    a step of exposing a photosensitive substrate to the pattern to be transferred, formed on the mask in the view angle, to transfer the pattern onto the substrate.

3. An exposure apparatus using X-rays as an exposure beam, said apparatus comprising:
    a light blocking plate, disposed at a position optically between an exposure beam source for providing an exposure beam and an X-ray transfer mask, for setting a view angle of exposure; and
    driving means for positioning said light blocking plate to set a view angle of exposure on the mask such that an inner edge of the attenuation area of the X-ray transfer mask overlaps a penumbra of the exposure beam provided by said light blocking member on the mask.

4. An exposure apparatus using X-rays as an exposure beam, said apparatus comprising:
    a light blocking plate, disposed in a position optically between an exposure beam source for providing an exposure beam and an X-ray transfer mask, for setting a view angle for exposure;
    driving means for positioning said light blocking plate to set a view angle of exposure on the mask such that an inner edge of the attenuation area of the X-ray transfer mask overlaps a penumbra of the exposure beam provided by said light blocking member on the mask;
    exposure area determining means for determining whether to expose the substrate with an outer area of the pattern to be transferred; and
    control means for controlling a position of said light blocking plate in accordance with a result of a determination by said determining means.

5. A semiconductor device manufacturing method using X-rays as an exposure beam, said method comprising:
    a step of setting, in an optical path, a light blocking member for limiting a view angle of exposure by blocking a portion of the exposure beam;
    a step of setting in the view angle an X-ray transfer mask having an attenuation area for attenuating the exposure beam at an outer periphery of a pattern to be transferred;
    a step of setting a view angle of exposure on the mask by positioning the light blocking member such that an inner edge of the attenuation area of the X-ray transfer mask overlaps a penumbra of the exposure beam provided by the light blocking member on the mask;
    a step of exposing a photosensitive substrate to the pattern to be transferred formed on the mask in the view angle to transfer the pattern onto the substrate; and
    a step of developing the photosensitive substrate after said exposing step.

6. An exposure method using X-rays as an exposure beam, said method comprising:

a step of setting, in an optical path, a light blocking member for limiting a view angle of exposure by blocking a portion of the exposure beam;

a step of setting in the view angle an X-ray transfer mask having an attenuation area for attenuating the exposure beam at an outer periphery of a pattern to be transferred;

a step of setting a view angle of exposure on the mask by positioning the light blocking member such that an inner edge of the attenuation area of the X-ray transfer mask overlaps a penumbra of the exposure beam provided by the light blocking member on the mask;

a step of determining whether to expose the substrate with an outer area of the pattern to be transferred;

a step of controlling a position of the light blocking plate in accordance with a result of a determination in said determining step;

a step of exposing a photosensitive substrate to the pattern to be transferred formed on the mask in the view angle to transfer the pattern onto the substrate; and a step of developing the photosensitive substrate after said exposing step.

* * * * *

UNITED STATES PATENT AND TRADEMARK OFFICE
CERTIFICATE OF CORRECTION

PATENT NO. : 6,463,119 B1
DATED : October 8, 2002
INVENTOR(S) : Shigeru Terashima et al.

It is certified that error appears in the above-identified patent and that said Letters Patent is hereby corrected as shown below:

Column 1,
Line 8, "for" should read -- for performing --;
Line 13, "X-ray" should read -- X-rays --; and "as" should read -- as from a --;
Line 14, "plasma" should read -- a plasma --;
Line 15, "A" should read -- An --; and "and" should read -- and an --;
Lines 16, 21, 32, 37, 54 and 64, "X-ray" should read -- X-rays --;
Line 17, "or" should read -- or from a --;
Line 26, "of" should read -- of an --;
Line 28, "X-ray," should read -- X-rays, --; and "40% approx" should read
-- approximately 40% --;
Line 29, "reduced" should read -- reduces --; and "X-ray is" should read -- X-rays are --;
Line 31, "angle," should read -- angle, such that --;
Line 33, "therefore" should read -- therefore causing --;
Line 39, "other" should read -- order --;
Line 44, "mask." should read -- mask is required. --;
Line 50, "the" should read -- regarding the --;
Line 52, "region" should read -- region, --;
Line 53, "penumbra" should read -- a penumbra, --; and
Line 66, "Particularly" should read -- Particularly, --.

Column 2,
Line 1, "and" should read -- and, --;
Line 8, "in" should read -- in a --; and "area" should read -- area being --;
Lines 18, 29, 40 and 52, "X-ray" should read -- X-rays --;
Line 19, "preparing" should read -- providing --;
Line 22, "area of" should read -- an area of a --;
Lines 23 and 49, "cover" should read -- covers --;
Line 25, "and" (second occurrence) should be deleted.
Line 30, "preparing" should read -- providing --;
Line 33, "with" should read -- with a --;
Line 35, "substrate;" should read -- substrate; and --;
Line 48, "area" should read -- an area of a --;
Line 60, "driving" should read -- and driving --;
Line 61, "with" should read -- with a --;
Line 66, "of" should read -- of performing --; and "position" should read -- positional --; and
Line 67, "of" should read -- of performing --.

UNITED STATES PATENT AND TRADEMARK OFFICE
CERTIFICATE OF CORRECTION

PATENT NO. : 6,463,119 B1
DATED : October 8, 2002
INVENTOR(S) : Shigeru Terashima et al.

It is certified that error appears in the above-identified patent and that said Letters Patent is hereby corrected as shown below:

Column 3,
Lines 3 and 19, "X-ray" should read -- X-rays --; and "radiation;" should read
-- radiation, --;
Line 7, "area" should read -- an area of a --;
Line 8, "cover" should read -- covers --;
Line 9, "mask;" should read -- mask, --;
Line 15, "of" should read -- of performing --; and "position" should read -- positional --;
Line 16, "of" should read -- of performing --;
Line 20, "preparing" should read -- providing --;
Line 21, "radiation;" should read -- radiation, and --;
Line 23, "selection" should read -- a selection --;
Line 25, "substrate;" should read -- substrate, --;
Lines 36 and 54, "part" should read -- portion --;
Lines 55 and 58, "X-ray" should read -- X-rays --;
Line 59, "a X-ray" should read -- an X-ray --;
Line 61, "exposure" should read -- exposure, --; and
Line 67, "left" should read -- left-hand --.

Column 4,
Lines 4, 23 and 32, "X-ray" should read -- X-rays --;
Lines 6 and 22, "X-ray." should read -- X-rays. --;
Line 8, "for" should read -- for performing --;
Line 9, "stages" should read -- and stages --;
Line 12, "X" should read -- X-ray --; and "source is a" should read -- source 1
generates --;
Line 13, "X" should read -- X-ray --;
Line 15, "micron." should read -- microns. --;
Line 17, "approx" should read -- approximately --;
Line 18, "tens" should read -- tens of --;
Line 20, "X-ray is" should read -- X-rays are --;
Line 27, "amount" should read -- an amount --; and "X-ray" should read -- X-rays --;
Line 36, "peripheral" should read -- peripheral portion --;
Line 39, "actually" should read -- actually, --; and "difficult." should read -- difficult to
achieve. --;
Line 41, "and" should read -- and in --;
Line 49, "process," should read -- process and --;
Line 54, "point" should read -- points --; "22a" should read -- 22a with --; and "between"
should read -- being between --;
Line 55, "and" (second occurrence) should read -- on --; and "curve." should read
-- curve 6. --;
Line 59, "(A)" should read -- (A), --; and
Line 62, "X-ray is" should read -- X-rays are --; and "(A)," should read -- (A), and --.

UNITED STATES PATENT AND TRADEMARK OFFICE
CERTIFICATE OF CORRECTION

PATENT NO. : 6,463,119 B1
DATED : October 8, 2002
INVENTOR(S) : Shigeru Terashima et al.

It is certified that error appears in the above-identified patent and that said Letters Patent is hereby corrected as shown below:

Column 5,
Lines 5, 11 and 14, "(B)" should read -- (B), --;
Line 7, "formed" should read -- formed to be --;
Line 8, "X-ray." should read -- X-rays. --;
Line 13, "part" should read -- portion --; and "X-ray." should read -- X-rays. --;
Line 21, "amount" should read -- amount occurs --;
Line 23, "case," should read -- a case, --;
Lines 26 and 38, "(C)" should read -- (C), --;
Line 27, "between the FIG. 2 (C) and FIGS." should read -- between the arrangment in Figure 2, (C), and that in Figures --;
Line 28, "(B)" should read -- (B), --; and "that" should read -- that an --;
Line 31, "5R" should read -- 5R, --;
Line 33, "mask 3" should read -- mask 3, --;
Line 36, "non-uniform" should read -- a non-uniform --;
Line 37, "from" should read -- from a --;
Line 40, "than in" should read -- than that shown in --;
Line 46, "a" should be deleted;
Line 58, "entering" should read -- X-rays from entering --;
Line 60, "FIGS. 3, 4" should read -- FIGS. 3 and 4 --; "illustration" should read -- illustrations --; and "part in" should read -- portion of --;
Line 65, "useed" should read -- used --;
Line 66, "step," should read -- step, and --; and
Line 67, "and" should be deleted.

Column 6,
Line 9, "outside" should read -- are provided outside --;
Line 23, "X-ray" should read -- X-rays --;
Line 24, "line 6" should read -- line 6 shown --; and "region 22" should read -- region 22, --;
Line 26, "exposegg" should read -- expose --;
Line 28, "5L" should read -- 5L, --;
Lines 29 and 57, "is" should read -- are --;
Line 33, "the" should be deleted;
Line 34, "Since the" should read -- The --;
Line 38, "boundary" should read -- the boundary --;
Line 41, "positive-type" should read -- a positive-type --;
Line 43, "negative" should read -- a negative --; and
Line 44, "FIGS. 4," should read -- In FIGS. 4, --.

UNITED STATES PATENT AND TRADEMARK OFFICE
CERTIFICATE OF CORRECTION

PATENT NO. : 6,463,119 B1
DATED : October 8, 2002
INVENTOR(S) : Shigeru Terashima et al.

It is certified that error appears in the above-identified patent and that said Letters Patent is hereby corrected as shown below:

Column 7,
Line 1, "30% approx," should read -- approximately 30%, --;
Line 7, "boundary" should read -- the boundary --;
Line 10, "positive-type" should read -- a positive-type --;
Line 12, "negative" should read -- a negative --;
Line 26, "X-ray," should read -- X-rays is reduced, --;
Line 31, "exposure" should read -- the exposure --;
Line 36, "selection" should read -- a selection --; and
Line 40, "structure" should read -- structures --.

Signed and Sealed this

Twenty-third Day of August, 2005

JON W. DUDAS
*Director of the United States Patent and Trademark Office*